(12) United States Patent
Eguchi et al.

(10) Patent No.: US 11,387,372 B2
(45) Date of Patent: Jul. 12, 2022

(54) SEMICONDUCTOR DEVICE

(71) Applicant: DENSO CORPORATION, Kariya (JP)

(72) Inventors: Kouji Eguchi, Kariya (JP); Teruaki Kumazawa, Kariya (JP); Yusuke Yamashita, Kariya (JP)

(73) Assignee: DENSO CORPORATION, Kariya (JP)

(*) Notice: Subject to any disclaimer, the term of this patent is extended or adjusted under 35 U.S.C. 154(b) by 9 days.

(21) Appl. No.: 16/929,712

(22) Filed: Jul. 15, 2020

(65) Prior Publication Data
US 2021/0020788 A1 Jan. 21, 2021

(30) Foreign Application Priority Data
Jul. 17, 2019 (JP) .............................. JP2019-132214

(51) Int. Cl.
*H01L 29/872* (2006.01)
(52) U.S. Cl.
CPC .................................. *H01L 29/872* (2013.01)
(58) Field of Classification Search
None
See application file for complete search history.

(56) References Cited

U.S. PATENT DOCUMENTS

2016/0308072 A1* 10/2016 Uchida ................. H01L 29/872
2019/0359640 A1* 11/2019 Xi ....................... C23C 16/45553

FOREIGN PATENT DOCUMENTS

| JP | 2012-248279 A | 12/2012 |
| JP | 2017-168672 A | 9/2017 |

\* cited by examiner

*Primary Examiner* — Xiaoming Liu
(74) *Attorney, Agent, or Firm* — Posz Law Group, PLC

(57) ABSTRACT

A semiconductor device includes; a schottky diode; a semiconductor substrate that includes a first surface and a second surface opposite to the first surface; a schottky electrode that is placed on the first surface and schottky-contacts to the semiconductor substrate; a first electrode placed on the schottky electrode; and a second electrode that is placed on the second surface and is connected to the semiconductor substrate. The schottky electrode is made of a metal material that is a columnar crystal; and a content of carbon on the schottky electrode is less than $6 \times 10^{19}$ cm$^{-3}$ in at least a part of an area of the schottky electrode.

5 Claims, 5 Drawing Sheets

SEMICONDUCTOR DEVICE

CROSS REFERENCE TO RELATED APPLICATION

The present application claims the benefit of priority from Japanese Patent Application No. 2019-132214 filed on Jul. 17, 2019. The entire disclosure of the above application is incorporated herein by reference.

TECHNICAL FIELD

The present disclosure relates to a semiconductor device including a schottky diode.

BACKGROUND

Conventionally, a semiconductor device including a schottky diode has been proposed. Specifically, in this semiconductor device, an insulation film is formed on a semiconductor substrate, and a schottky electrode is formed so as to schottky-contact with the semiconductor substrate via a contact hole formed in the insulation film. In the semiconductor device, a front surface electrode is formed on the schottky electrode. The schottky electrode includes molybdenum (Mo), nickel (Ni), titanium (Ti), or the like in consideration of a forward voltage, a leakage characteristic, or the like.

SUMMARY

A semiconductor device may include; a schottky diode; a semiconductor substrate that may include a first surface and a second surface opposite to the first surface; a schottky electrode that may be placed on the first surface and schottky-contacts to the semiconductor substrate; a first electrode placed on the schottky electrode; and a second electrode that may be placed on the second surface and be connected to the semiconductor substrate. The schottky electrode may be made of a metal material that is a columnar crystal; and a content of carbon on the schottky electrode may be less than $6 \times 10^{19}$ cm$^{-3}$ in at least a part of an area of the schottky electrode.

BRIEF DESCRIPTION OF DRAWINGS

The above and other objects, features and advantages of the present disclosure will become more apparent from the following detailed description made with reference to the accompanying drawings. In the drawings.

DETAILED DESCRIPTION

Figure 1:
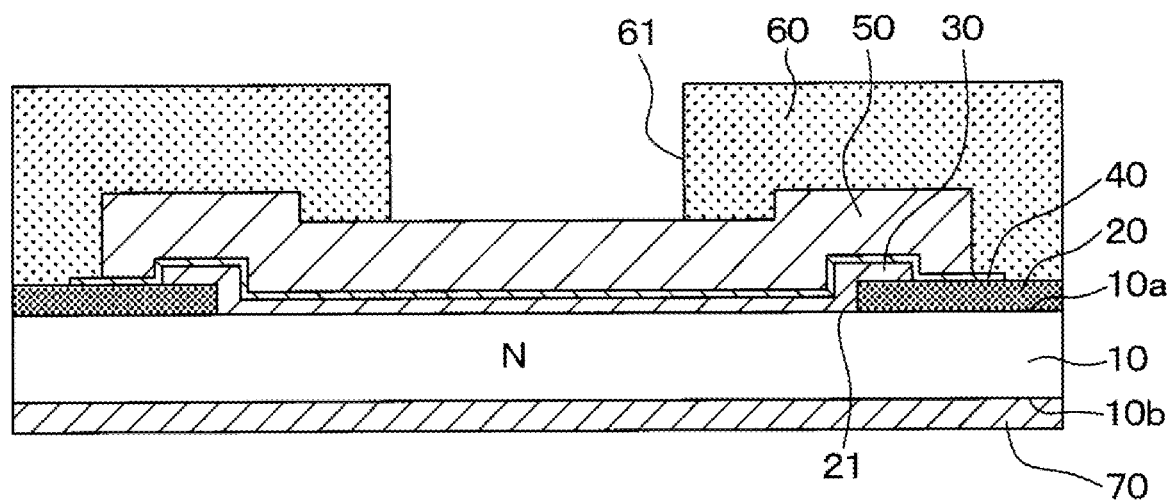
FIG. 1 is a cross-sectional view of a semiconductor device in a first embodiment.

A schottky electrode and a front surface electrode in such a semiconductor device are formed as follows. That is, after a schottky film that configures the schottky electrode is formed, a resist is placed on the schottky film. After the resist is patterned, the resist is used as the mask and the schottky film is patterned. Thereby, the schottky electrode is configured. Thereafter, the resist is stripped by using a stripping liquid.

Next, after a front surface electrode film configuring the front surface electrode is formed on the schottky electrode, the resist is placed on the front surface electrode film. After the resist is patterned, the resist is used as the mask and the front surface electrode film is patterned. Thereby, the front surface electrode is configured. Thereafter, the resist is stripped by using a stripping liquid. In this way, the schottky electrode and the front surface electrode in the semiconductor device described above are formed.

However, as a result of studies of the inventors, it has been confirmed that, since the molybdenum or the like configuring the schottky electrode is a columnar crystal, the resist may remain on the schottky electrode when the semiconductor device is manufactured by the manufacturing method described above. Further, it has been confirmed that the remaining resist may form the unevenness of the front surface electrode formed on the schottky electrode. In this case, when the unevenness having a large height difference is formed on the front surface electrode, a connectivity with a connection member such as a bonding wire or the like connected to the front surface electrode may be deteriorated.

One example of the present disclosure provides a semiconductor device capable of reducing a height difference of an unevenness formed in a front surface electrode.

According to one example embodiment, a semiconductor device includes; a schottky diode; a semiconductor substrate that includes a first surface and a second surface opposite to the first surface; a schottky electrode that is placed on the first surface and schottky-contacts to the semiconductor substrate; a first electrode placed on the schottky electrode; and a second electrode that is placed on the second surface and is connected to the semiconductor substrate. The schottky electrode is made of a metal material that is a columnar crystal; and a content of carbon on the schottky electrode is less than $6 \times 10^{19}$ cm$^{-3}$ in at least a part of an area of the schottky electrode.

Thereby, since the carbon content of the surface electrode is less than $6 \times 10^{19}$ cm$^{-3}$, it may be possible to reduce the height difference of the unevenness formed in the front surface electrode. Accordingly, when the connection member is connected to the front surface electrode, it may be possible to prevent the connectivity from decreasing.

Hereinafter, embodiments of the present disclosure will be described with reference to the drawings. In each embodiment described below, same or equivalent parts are designated with the same reference numerals.

First Embodiment

A first embodiment will be described with reference to the drawings. A configuration of a semiconductor device in the present embodiment will be described.

The semiconductor device in the present embodiment includes a semiconductor substrate 10 that is made of an N-type silicon surface or the like, and includes a first surface 10a and a second surface 10b opposite to the first surface 10a. On the first surface 10a of the semiconductor substrate 10, an insulation film 20 made of a silicon oxide film or the like is placed. The insulation film 20 includes an opening 21 that exposes a predetermined portion of the first surface 10a of the semiconductor substrate 10.

On the insulation film 20, a schottky electrode 30 contacting to the semiconductor substrate 10 through the opening 21 is formed. The schottky electrode 30 is made of a metal material that schottky-contacts to the semiconductor substrate 10, and, in the present embodiment, is made of the molybdenum. Although the molybdenum is a suitable metal material for the schottky contact, the molybdenum is a columnar crystal.

On the schottky electrode 30, a barrier layer 40 is placed. In the present embodiment, the barrier layer 40 is configured by stacking titanium and titanium nitride (TiN). On the barrier layer 40, a front surface electrode 50 is placed. The front surface electrode 50 is made of aluminum silicon (AlSi). In the present embodiment, the front surface electrode 50 may correspond to a first electrode.

In this way, by forming the front surface electrode 50 on the schottky electrode 30, it may be possible to satisfactorily connect the connection member such as the bonding wire to the semiconductor device. A protection film 60 is made of polyimide or the like so as to cover the front surface electrode 50. The protection film 60 includes an opening 61 that exposes a part of the front surface electrode 50.

On the side of the second surface 10b of the semiconductor substrate 10, a rear surface electrode 70 is formed. The rear surface electrode 70 is, for example, an ohmic electrode in which nickel silicide (NiSi), titanium, nickel, gold (Au) or the like are stacked in order from the semiconductor substrate 10. In the present embodiment, the rear surface electrode 70 may correspond to a second electrode.

In such a manner, the semiconductor device including the schottky diode in the present embodiment is configured. Although the details will be described later, such a semiconductor device is manufactured by a manufacturing method of the semiconductor device as shown in FIGS. 5A to 5H. The manufacturing method includes a process of stripping a resist 100 placed on the schottky electrode 30. In this case, a carbon configuring the resist 100 may remain on the schottky electrode 30 made of the columnar crystal. This carbon may form the unevenness of the front surface electrode 50.

Figure 2:
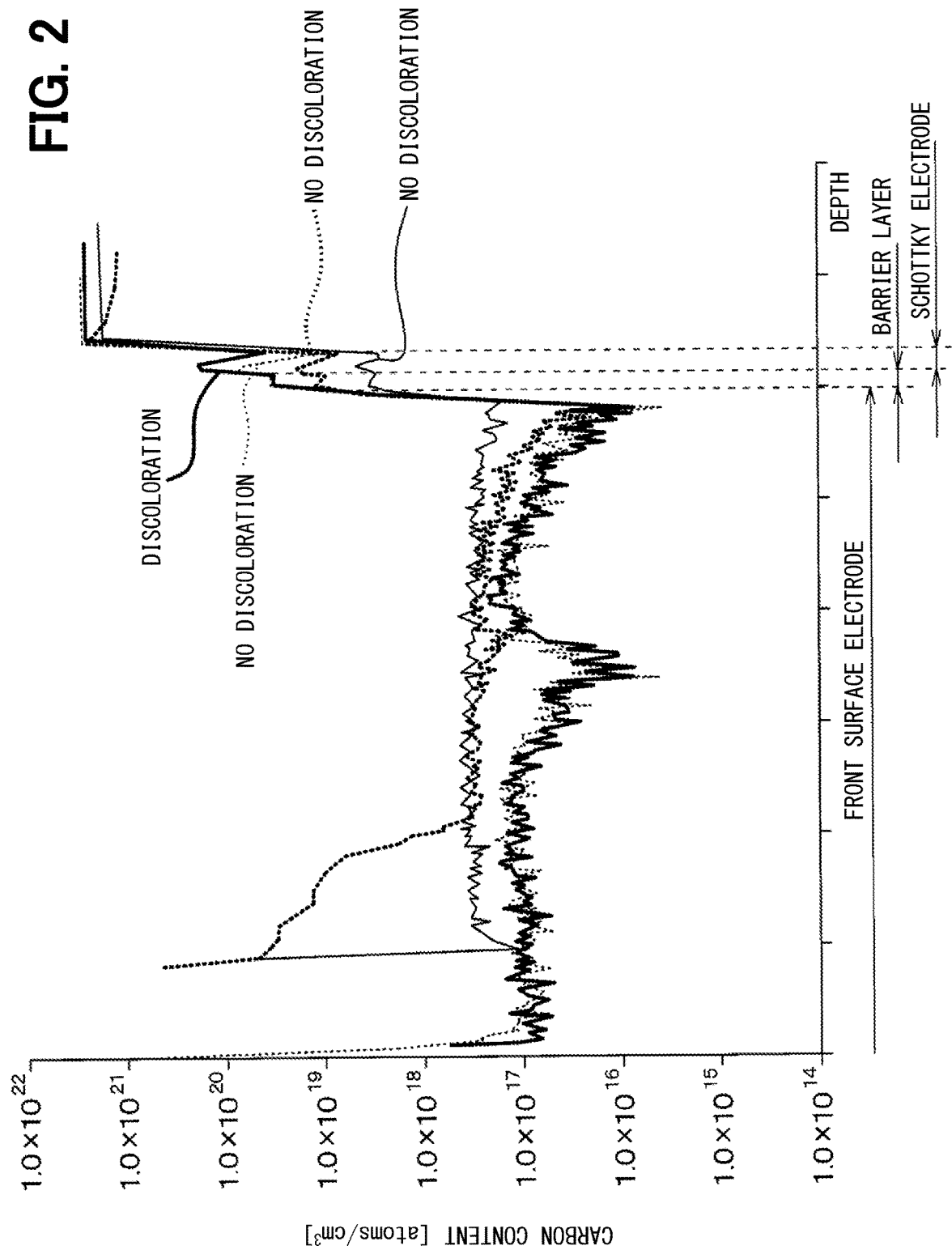
FIG. 2 is an experimental result showing a relation between a depth and a carbon content.

Therefore, the present inventors performed an appearance inspection on the front surface electrode 50 in the semiconductor device described above, measured carbon contents of a portion where discoloration of the front surface electrode 50 is confirmed and a portion where the discoloration is not confirmed, and obtained the results shown in FIG. 2. When the discoloration of the front surface electrode 50 is observed, the unevenness having the height difference is formed in the front surface electrode 50. In FIG. 2, the carbon content is a result obtained by measurement using a secondary ion mass spectrometry.

As shown in FIG. 2, it has been confirmed that the content of the carbon remaining on the schottky electrode 30 in an area where the discoloration is observed is larger than that in an area where the discoloration is not observed.

Figure 3:
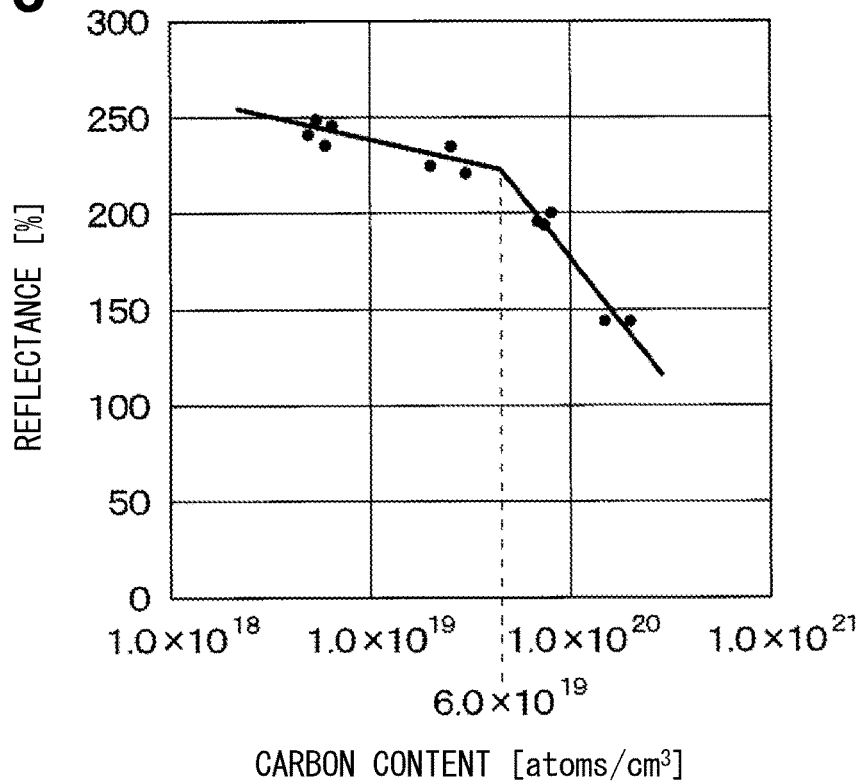
FIG. 3 is an experimental result showing a relation between the carbon content and a reflectance.
Figure 4:
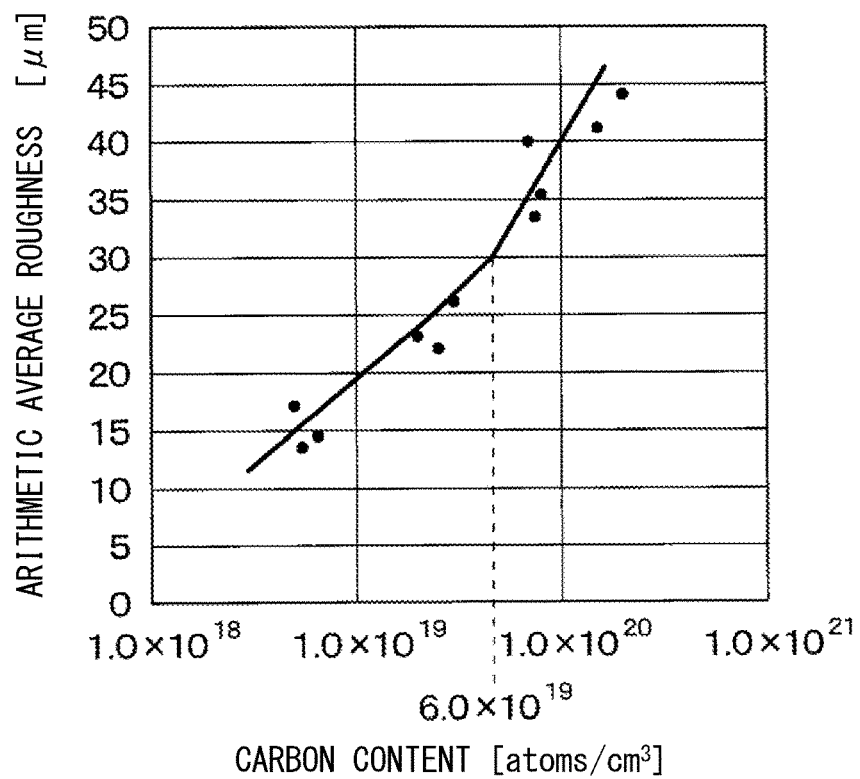
FIG. 4 is an experimental result showing a relation between the carbon content and an arithmetic average roughness.

The present inventors further diligently studied the carbon remaining on the schottky electrode 30, and obtained the results shown in FIG. 3 and FIG. 4. In FIG. 3 and FIG. 4, the carbon content is the result obtained by the measurement using the secondary ion mass spectrometry. In FIG. 3, the reflectance is a result of measurement using an optical interference type film thickness measurement instrument. In FIG. 4, the arithmetic average roughness is a result of observing the front surface electrode 50 with use of an atomic force microscope.

As shown in FIG. 3, it has been confirmed that the reflectance sharply increases when the carbon content is equal to or higher than $6 \times 10^{19}$ cm$^{-3}$. That is, the discoloration is easily confirmed in the appearance detection when the carbon content is equal to or higher than $6 \times 10^{19}$ cm$^{-3}$. As shown in FIG. 4, it has been confirmed that the arithmetic average roughness sharply increases when the carbon content is equal to or higher than $6 \times 10^{19}$ cm$^{-3}$.

Therefore, in the present embodiment, the remaining carbon content on the schottky electrode 30 is less than $6 \times 10^{19}$ cm$^{-3}$. Thereby, it may be possible to reduce the height difference of the unevenness of the front surface electrode 50. In the present embodiment, the carbon content is less than $6 \times 10^{19}$ cm$^{-3}$ in the entire area of the schottky electrode 30 in the surface direction of the semiconductor substrate 10.

Next, manufacturing method of the semiconductor device described above will be described above.

Figure 5A:
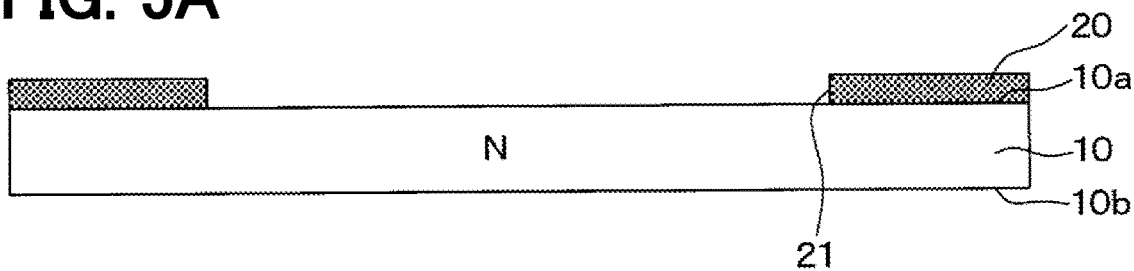
FIG. 5A is a sectional view illustrating a manufacturing process of the semiconductor device of FIG. 1.

First, as shown in FIG. 5A, the semiconductor substrate 10 that includes an N-type silicon substrate or the like is prepared. The insulation film 20 is formed on the first surface 10a of the semiconductor substrate 10 by a CVD (Chemical Vapor Deposition) method or the like. Thereafter, the resist (not shown) is patterned and used as the mask, and a dry etching or the like is performed. Thereby, the opening 21 that corresponds to an opening of a predetermined region of the first surface 10a is formed.

Figure 5B:
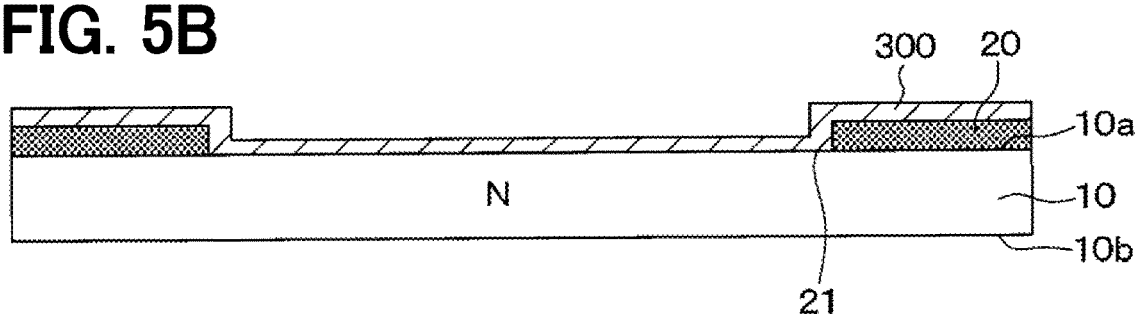
FIG. 5B is a cross-sectional view illustrating a manufacturing process of the semiconductor device subsequent to FIG. 5A.

Next, as shown in FIG. 5B, a schottky film 300 made of the molybdenum or the like is formed on the first surface 10a of the semiconductor substrate 10 by a PVD (Physical Vapor Deposition) or the like. Since the schottky film 300 is made of the molybdenum, the schottky film 300 is the columnar crystal.

Figure 5C:
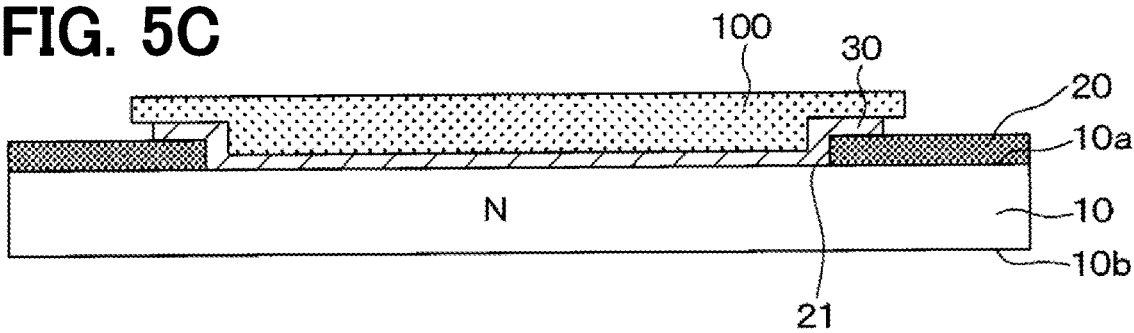
FIG. 5C is a cross-sectional view illustrating a manufacturing process of the semiconductor device subsequent to FIG. 5B.

Subsequently, as shown in FIG. 5C, the resist 100 is placed on the schottky film 300 and patterned. The resist 100 is used as the mask, wet etching is performed. Thereby, the schottky film 300 is patterned and the schottky electrode 30 is formed.

Figure 5D:
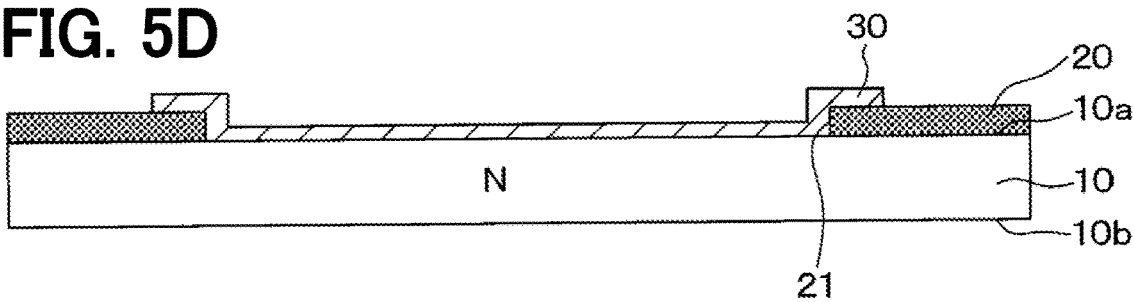
FIG. 5D is a cross-sectional view illustrating a manufacturing process of the semiconductor device subsequent to FIG. 5C.

Thereafter, as shown in FIG. 5D, the resist 100 is removed. In the present embodiment, the removal of the resist 100 is performed by using a mixed liquid including ammonia, amine, or the like as a stripping liquid and introducing the semiconductor substrate 10 where the resist 100 is placed into the stripping liquid for cleaning. Then, since the schottky electrode 30 is made of the molybdenum and is the columnar crystal, the carbon configuring the resist 100 is likely to remain between adjacent crystals.

Therefore, in the present embodiment, the stripping liquid is maintained at 65 to 75° C., which has not been specified in the conventional configuration. Thereby, it may be possible to prevent the striping function of the resist 100 from being deteriorated during the cleaning, and prevent the resist 100 from remaining on the schottky electrode 30. That is, the content of the carbon remaining on the schottky electrode 30 can be less than $6 \times 10^{19}$ $cm^{-3}$.

Thereafter, although not shown in particular, a heating process is performed at about 600°, and thereby the crystallinity of the schottky electrode 30 (that is, the molybdenum) is improved and the forward voltage, the leak characteristic, or the like is set to a desired value.

Figure 5E:
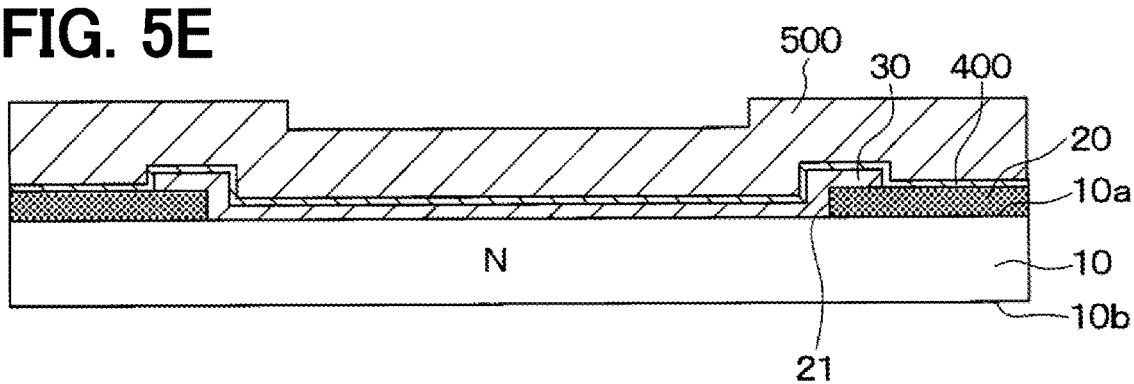
FIG. 5E is a cross-sectional view illustrating a manufacturing process of the semiconductor device subsequent to FIG. 5D.

Subsequently, as shown in FIG. 5E, films of the titanium and the titanium nitride are sequentially formed for forming a barrier film 400, and a film of aluminum silicon is formed for forming a front surface electrode film 500.

Figure 5F:
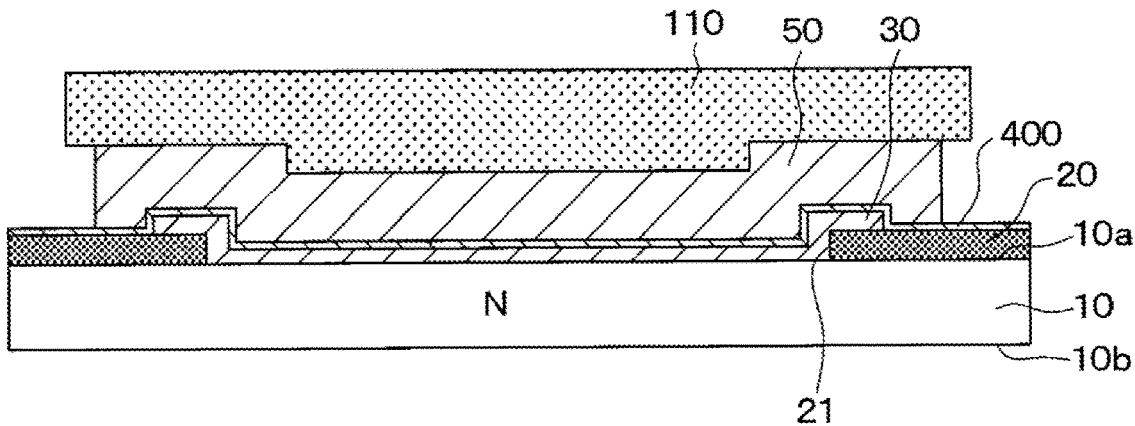
FIG. 5F is a cross-sectional view illustrating a manufacturing process of the semiconductor device subsequent to FIG. 5E.

Thereafter, as shown in FIG. 5F, a resist 110 is placed on the front surface electrode film 500 to be patterned. The resist 110 is used as the mask, and the wet etching or the like is performed. Thereby, a front surface electrode film 500 is patterned, and the front surface electrode 50 is formed.

Figure 5G:
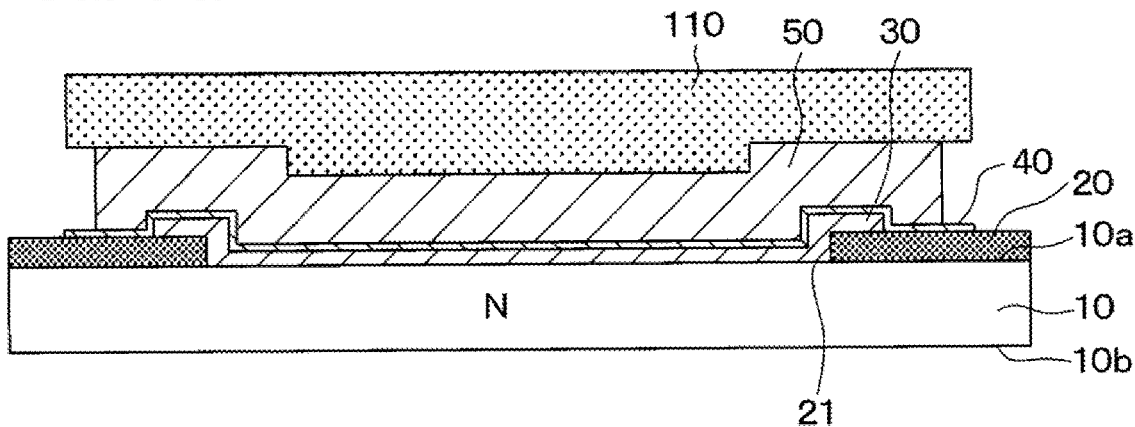
FIG. 5G is a cross-sectional view illustrating a manufacturing process of the semiconductor device subsequent to FIG. 5F.

As shown in FIG. 5G, the resist 110 is used as the mask, and dry etching or the like is performed. Thereby, the barrier film 400 is patterned and the barrier layer 40 is formed.

Figure 5H:
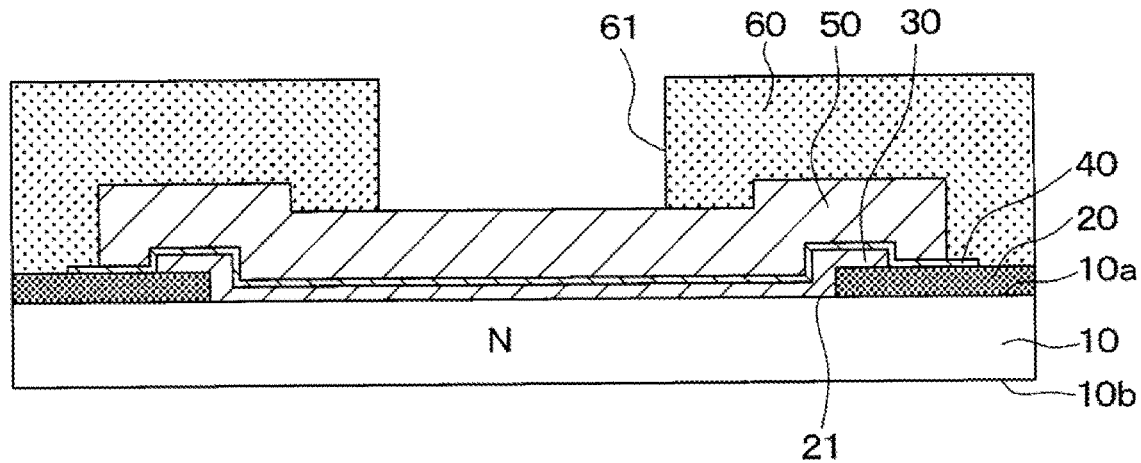
FIG. 5H is a cross-sectional view illustrating a manufacturing process of the semiconductor device subsequent to FIG. 5G.

Subsequently, as shown in FIG. 5H, the protection film 60 is formed by applying the polyimide or the like. The resist (not shown) or the like is patterned and used as the mask, and the dry etching or the like is performed. Thereby, the opening 61 that corresponds to an opening of a predetermined area of the front surface electrode 50 is formed. Thereafter, although not shown in particular, the rear surface electrode 70 is formed on the side of the second surface 10b of the semiconductor substrate 10. Thereby, the semiconductor device described above is manufactured.

As described above, in the present embodiment, the remaining carbon content on the schottky electrode 30 is less than $6 \times 10^{19}$ $cm^{-3}$. Therefore, it may be possible to reduce the height difference of the unevenness of the front surface electrode 50. Accordingly, when the connection member is connected to the front surface electrode 50, it may be possible to reduce the connectivity.

Other Embodiments

The present disclosure is not limited to the above-described embodiments and may be appropriately modified.

For example, in the embodiment described above, the remaining carbon content on the schottky electrode 30 may be less than $6 \times 10^{19}$ $cm^{-3}$ in at least a part of the area. According to this, in the front surface electrode 50 on the schottky electrode 30 of which remaining carbon content is less than $6 \times 10^{19}$ $cm^{-3}$, the height difference of the unevenness becomes small.

The schottky electrode 30 may be made of a metal material including nickel or titanium as a main component, instead of the molybdenum.

The invention claimed is:

1. A semiconductor device including a schottky diode, the semiconductor device comprising:
   a semiconductor substrate that includes a first surface and a second surface opposite to the first surface;
   a schottky electrode that is placed on the first surface and schottky-contacts to the semiconductor substrate;
   a first electrode placed on the schottky electrode; and
   a second electrode that is placed on the second surface and is connected to the semiconductor substrate,
   wherein:
   the schottky electrode is made of a metal material that is a columnar crystal;
   carbon is present in at least a part of an area of the schottky electrode;
   a content of the carbon present in the at least the part of the area of the schottky electrode is less than $6 \times 10^{19}$ $cm^{-3}$, and
   the carbon present in the at least the part of the area of the schottky electrode is a carbon residue from a resist.

2. The semiconductor device according to claim 1, wherein:
   the schottky electrode is made of a metal material including molybdenum, nickel, or titanium as a main component.

3. The semiconductor device according to claim 1, wherein:
   a content of carbon present in an entire area of the schottky electrode is less than $6 \times 10^{19}$ $cm^{-3}$.

4. The semiconductor device according to claim 1, wherein:
   the first electrode has an electrode surface opposite to the schottky electrode, and
   the electrode surface has an arithmetic average roughness of less than 30 μm at a part corresponding to the at least the part of the area of the schottky electrode.

5. The semiconductor device according to claim 1, wherein:
   the content of the carbon residue is less than $5 \times 10^{19}$ $cm^{-3}$.

* * * * *